(12) United States Patent
Sun et al.

(10) Patent No.: US 7,384,534 B2
(45) Date of Patent: *Jun. 10, 2008

(54) ELECTROLYTE WITH GOOD PLANARIZATION CAPABILITY, HIGH REMOVAL RATE AND SMOOTH SURFACE FINISH FOR ELECTROCHEMICALLY CONTROLLED COPPER CMP

(75) Inventors: Lizhong Sun, San Jose, CA (US); Feng Q. Liu, Cupertino, CA (US); Siew Neo, Santa Clara, CA (US); Stan Tsai, Fremont, CA (US); Liang-Yuh Chen, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 505 days.

This patent is subject to a terminal disclaimer.

(21) Appl. No.: 11/074,274

(22) Filed: Mar. 7, 2005

(65) Prior Publication Data

US 2005/0145507 A1  Jul. 7, 2005

Related U.S. Application Data

(63) Continuation of application No. 10/141,459, filed on May 7, 2002, now Pat. No. 6,863,797, which is a continuation-in-part of application No. 10/032,275, filed on Dec. 21, 2001, now Pat. No. 6,899,804.

(51) Int. Cl.
*C25F 3/00* (2006.01)
*C09K 13/06* (2006.01)

(52) U.S. Cl. .................. 205/684; 205/682; 252/79.4

(58) Field of Classification Search .............. 205/674, 205/682, 684; 252/62.2, 79.1, 79.4
See application file for complete search history.

(56) References Cited

U.S. PATENT DOCUMENTS

| 2,582,020 | A | 1/1952 | Emery |
| 3,239,441 | A | 3/1966 | Marosi |
| 3,873,512 | A | 3/1975 | Latanision |

(Continued)

FOREIGN PATENT DOCUMENTS

EP  0 527 537  2/1993

(Continued)

OTHER PUBLICATIONS

D. Landolt, "Fundamental Aspects of Electropolishing", Mar. 18, 1996, pp. 1-11.

(Continued)

*Primary Examiner*—Patrick Joseph Ryan
*Assistant Examiner*—Thomas H. Parsons
(74) *Attorney, Agent, or Firm*—Patterson & Sheridan

(57) ABSTRACT

Electrolyte compositions and methods for planarizing a surface of a substrate using the electrolyte compositions are provided. In one aspect, an electrolyte composition includes one or more chelating agents, one or more corrosion inhibitors, and one or more pH adjusting agents. In another aspect, an electrolyte composition includes one or more chelating agents, two or more corrosion inhibitors, and one or more pH adjusting agents. In another aspect, an electrolyte composition includes one or more chelating agents, one or more corrosion inhibitors, one or more pH adjusting agents, and one or more electrically resistive additives.

16 Claims, 1 Drawing Sheet

U.S. PATENT DOCUMENTS

| | | |
|---|---|---|
| 4,263,113 A | 4/1981 | Bernard |
| 4,369,099 A | 1/1983 | Kohl et al. |
| 4,663,005 A | 5/1987 | Edson |
| 4,666,683 A | 5/1987 | Brown et al. |
| 4,793,895 A | 12/1988 | Kaanta et al. |
| 4,934,102 A | 6/1990 | Leach et al. |
| 4,992,135 A | 2/1991 | Doan |
| 5,002,645 A | 3/1991 | Eastland et al. |
| 5,096,550 A | 3/1992 | Mayer et al. |
| 5,114,548 A | 5/1992 | Rhoades |
| 5,129,981 A | 7/1992 | Wang et al. |
| 5,209,816 A | 5/1993 | Yu et al. |
| 5,217,586 A | 6/1993 | Datta et al. |
| 5,225,034 A | 7/1993 | Yu et al. |
| 5,256,565 A | 10/1993 | Bernhardt et al. |
| 5,340,370 A | 8/1994 | Cadien et al. |
| 5,391,258 A | 2/1995 | Branacaleoni et al. |
| 5,407,526 A | 4/1995 | Danielson et al. |
| 5,534,106 A | 7/1996 | Cote et al. |
| 5,543,032 A | 8/1996 | Datta et al. |
| 5,567,300 A | 10/1996 | Datta et al. |
| 5,575,706 A | 11/1996 | Tsai et al. |
| 5,770,095 A | 6/1998 | Sasaki et al. |
| 5,783,489 A | 7/1998 | Kaufman et al. |
| 5,800,577 A | 9/1998 | Kido |
| 5,804,507 A | 9/1998 | Tolles et al. |
| 5,807,165 A | 9/1998 | Uzoh et al. |
| 5,843,032 A | 12/1998 | Kastenhofer |
| 5,846,882 A | 12/1998 | Birang |
| 5,866,031 A | 2/1999 | Carprio et al. |
| 5,880,003 A | 3/1999 | Hayashi |
| 5,897,375 A | 4/1999 | Watts et al. |
| 5,911,619 A | 6/1999 | Uzoh et al. |
| 5,954,997 A | 9/1999 | Kaufman et al. |
| 5,965,036 A | 10/1999 | Maki et al. |
| 6,001,730 A | 12/1999 | Farkas et al. |
| 6,004,880 A | 12/1999 | Liu et al. |
| 6,056,864 A | 5/2000 | Cheung |
| 6,063,306 A | 5/2000 | Kaufman et al. |
| 6,066,030 A | 5/2000 | Uzoh |
| 6,068,879 A | 5/2000 | Pasch |
| 6,077,412 A | 6/2000 | Ting et al. |
| 6,083,840 A | 7/2000 | Mravic et al. |
| 6,090,239 A | 7/2000 | Liu et al. |
| 6,096,652 A | 8/2000 | Watts et al. |
| 6,099,604 A | 8/2000 | Sandhu et al. |
| 6,103,096 A | 8/2000 | Datta et al. |
| 6,106,728 A | 8/2000 | Iida et al. |
| 6,117,775 A | 9/2000 | Kondo et al. |
| 6,117,783 A | 9/2000 | Small et al. |
| 6,117,853 A | 9/2000 | Sakai et al. |
| 6,121,152 A | 9/2000 | Adams et al. |
| 6,126,798 A | 10/2000 | Reid et al. |
| 6,126,853 A | 10/2000 | Kaufman et al. |
| 6,139,763 A | 10/2000 | Ina et al. |
| 6,143,155 A | 11/2000 | Adams et al. |
| 6,143,656 A | 11/2000 | Yang et al. |
| 6,153,043 A | 11/2000 | Edelstein et al. |
| 6,171,352 B1 | 1/2001 | Lee et al. |
| 6,176,992 B1 | 1/2001 | Talieh |
| 6,177,026 B1 | 1/2001 | Wang et al. |
| 6,190,237 B1 | 2/2001 | Huyng et al. |
| 6,194,317 B1 | 2/2001 | Kaisaki et al. |
| 6,206,756 B1 | 3/2001 | Chopra et al. |
| 6,217,416 B1 | 4/2001 | Kaufman et al. |
| 6,218,305 B1 | 4/2001 | Hosali et al. |
| 6,234,870 B1 | 5/2001 | Uzoh et al. |
| 6,238,592 B1 | 5/2001 | Hardy et al. |
| 6,248,222 B1 | 6/2001 | Wang |
| 6,258,711 B1 | 7/2001 | Laursen |
| 6,258,721 B1 | 7/2001 | Li et al. |
| 6,273,786 B1 | 8/2001 | Chopra et al. |
| 6,276,996 B1 | 8/2001 | Chopra |
| 6,280,598 B1 | 8/2001 | Barton et al. |
| 6,296,400 B1 | 10/2001 | Uchiyama et al. |
| 6,299,741 B1 | 10/2001 | Sun et al. |
| 6,303,049 B1 | 10/2001 | Lee et al. |
| 6,303,551 B1 | 10/2001 | Li et al. |
| 6,310,019 B1 | 10/2001 | Kakizawa et al. |
| 6,315,803 B1 | 11/2001 | Ina et al. |
| 6,315,883 B1 | 11/2001 | Mayer et al. |
| 6,348,076 B1 | 2/2002 | Canaperi et al. |
| 6,354,916 B1 | 3/2002 | Uzoh et al. |
| 6,355,075 B1 | 3/2002 | Ina et al. |
| 6,355,153 B1 | 3/2002 | Uzoh et al. |
| 6,361,422 B1 | 3/2002 | Ettinger et al. |
| 6,375,693 B1 | 4/2002 | Cote et al. |
| 6,379,223 B1 | 4/2002 | Sun et al. |
| 6,391,166 B1 | 5/2002 | Wang |
| 6,395,152 B1 | 5/2002 | Wang |
| 6,402,925 B2 | 6/2002 | Talieh |
| 6,416,685 B1 | 7/2002 | Zhang et al. |
| 6,419,554 B2 | 7/2002 | Chopra et al. |
| 6,428,721 B1 | 8/2002 | Ina et al. |
| 6,429,133 B1 | 8/2002 | Chopra |
| 6,440,186 B1 | 8/2002 | Sakai et al. |
| 6,440,295 B1 | 8/2002 | Wang |
| 6,447,371 B2 | 9/2002 | Brusic Kaufman et al. |
| 6,447,668 B1 | 9/2002 | Wang |
| 6,454,819 B1 | 9/2002 | Yano et al. |
| 6,455,479 B1 | 9/2002 | Sahbari |
| 6,508,952 B1 | 1/2003 | Lee et al. |
| 6,541,384 B1 | 4/2003 | Sun et al. |
| 6,551,935 B1 | 4/2003 | Sinha et al. |
| 6,555,158 B1 | 4/2003 | Yoshio et al. |
| 6,562,719 B2 | 5/2003 | Kondo et al. |
| 6,565,619 B1 | 5/2003 | Asano et al. |
| 6,568,997 B2 | 5/2003 | Costas et al. |
| 6,569,349 B1 | 5/2003 | Wang et al. |
| 6,579,153 B2 | 6/2003 | Uchikura et al. |
| 6,582,579 B1 | 6/2003 | Uzoh |
| 6,592,742 B2 | 7/2003 | Sun et al. |
| 6,593,239 B2 | 7/2003 | Kaufman et al. |
| 6,596,152 B2 | 7/2003 | Yang et al. |
| 6,596,638 B1 | 7/2003 | Kondo et al. |
| 6,602,112 B2 | 8/2003 | Tran et al. |
| 6,605,537 B2 | 8/2003 | Bian et al. |
| 6,613,200 B2 | 9/2003 | Li et al. |
| 6,616,976 B2 | 9/2003 | Montano et al. |
| 6,620,215 B2 | 9/2003 | Li et al. |
| 6,653,242 B1 | 11/2003 | Sun et al. |
| 6,676,484 B2 | 1/2004 | Chopra |
| 6,679,928 B2 | 1/2004 | Costas et al. |
| 6,679,929 B2 | 1/2004 | Asano et al. |
| 6,693,036 B1 | 2/2004 | Nogami et al. |
| 6,699,299 B2 | 3/2004 | Sanchan et al. |
| 6,736,952 B2 | 5/2004 | Emesh et al. |
| 6,811,680 B2 | 11/2004 | Chen et al. |
| 6,821,409 B2 | 11/2004 | Basol et al. |
| 6,821,881 B2 | 11/2004 | Tsai et al. |
| 6,837,983 B2 | 1/2005 | Duboust et al. |
| 6,852,630 B2 | 2/2005 | Basol et al. |
| 6,867,136 B2 | 3/2005 | Basol et al. |
| 6,893,476 B2 | 5/2005 | Siddiqui et al. |
| 6,899,804 B2 | 5/2005 | Duboust et al. |
| 6,902,659 B2 | 6/2005 | Talieh |
| 6,943,112 B2 | 9/2005 | Basol et al. |
| 6,946,066 B2 | 9/2005 | Basol et al. |
| 2001/0016469 A1 | 8/2001 | Chopra |
| 2001/0024878 A1 | 9/2001 | Nakamura |
| 2001/0036746 A1 | 11/2001 | Sato et al. |
| 2001/0042690 A1 | 11/2001 | Talieh |
| 2001/0052351 A1 | 12/2001 | Brown et al. |
| 2002/0008036 A1 | 1/2002 | Wang |

| | | | |
|---|---|---|---|
| 2002/0016064 A1 | 2/2002 | Komai et al. | |
| 2002/0016073 A1 | 2/2002 | Kondo et al. | |
| 2002/0016272 A1 | 2/2002 | Kakizawa et al. | |
| 2002/0040100 A1 | 4/2002 | Kume et al. | |
| 2002/0070126 A1 | 6/2002 | Sato et al. | |
| 2002/0072309 A1 | 6/2002 | Sato et al. | |
| 2002/0074230 A1 | 6/2002 | Basol | |
| 2002/0088709 A1 | 7/2002 | Hongo et al. | |
| 2002/0096659 A1 | 7/2002 | Sakai et al. | |
| 2002/0104764 A1 | 8/2002 | Gautum et al. | |
| 2002/0108861 A1 | 8/2002 | Emesh et al. | |
| 2002/0108864 A1 | 8/2002 | Yang et al. | |
| 2002/0119286 A1 | 8/2002 | Chen et al. | |
| 2002/0130049 A1 | 9/2002 | Chen et al. | |
| 2002/0139055 A1 | 10/2002 | Asano et al. | |
| 2002/0160698 A1 | 10/2002 | Sato et al. | |
| 2002/0182982 A1 | 12/2002 | Jui-Lung et al. | |
| 2003/0019755 A1 | 1/2003 | Hey et al. | |
| 2003/0038038 A1 | 2/2003 | Basol et al. | |
| 2003/0073311 A1 | 4/2003 | Joseph et al. | |
| 2003/0073386 A1 | 4/2003 | Ma et al. | |
| 2003/0079416 A1 | 5/2003 | Ma et al. | |
| 2003/0083214 A1 | 5/2003 | Kakizawa et al. | |
| 2003/0104762 A1 | 6/2003 | Sato et al. | |
| 2003/0113996 A1 | 6/2003 | Nogami et al. | |
| 2003/0114004 A1 | 6/2003 | Sato et al. | |
| 2003/0115475 A1 | 6/2003 | Russo et al. | |
| 2003/0116445 A1 | 6/2003 | Sun et al. | |
| 2003/0116446 A1 | 6/2003 | Duboust et al. | |
| 2003/0119311 A1 | 6/2003 | Basol et al. | |
| 2003/0136055 A1 | 7/2003 | Li et al. | |
| 2003/0153184 A1 | 8/2003 | Wang et al. | |
| 2003/0170091 A1 | 9/2003 | Shomler et al. | |
| 2003/0178320 A1 | 9/2003 | Liu et al. | |
| 2003/0216045 A1 | 11/2003 | Wang et al. | |
| 2003/0234184 A1 | 12/2003 | Liu et al. | |
| 2004/0053499 A1 | 3/2004 | Liu et al. | |
| 2004/0144038 A1 | 7/2004 | Siddiqui | |
| 2004/0231994 A1 | 11/2004 | Basol et al. | |
| 2004/0248412 A1 | 12/2004 | Liu et al. | |
| 2005/0044803 A1 | 3/2005 | Siddiqui et al. | |
| 2005/0565378 | 3/2005 | Chen et al. | |
| 2005/0076578 A1 | 4/2005 | Siddiqui et al. | |
| 2005/0076579 A1 | 4/2005 | Siddiqui et al. | |
| 2005/0079718 A1 | 4/2005 | Siddiqui et al. | |
| 2005/0079803 A1 | 4/2005 | Siddiqui et al. | |
| 2005/0145507 A1 | 7/2005 | Sun et al. | |
| 2005/0218010 A1 | 10/2005 | Wang et al. | |
| 2005/0227483 A1 | 10/2005 | Basol et al. | |
| 2006/0006074 A1 | 1/2006 | Liu et al. | |
| 2006/0009033 A1 | 1/2006 | Basol et al. | |
| 2006/0011485 A1 | 1/2006 | Basol et al. | |

FOREIGN PATENT DOCUMENTS

| | | |
|---|---|---|
| EP | 0 699 782 | 3/1996 |
| EP | 0 811 665 | 12/1997 |
| EP | 0 846 742 | 6/1998 |
| EP | 1 103 346 | 5/2001 |
| EP | 1 167 585 | 1/2002 |
| EP | 1 170 761 | 9/2002 |
| EP | 1 410 430 | 4/2004 |
| JP | 58-093886 | 6/1983 |
| JP | 58-093899 | 6/1983 |
| JP | 05 302199 | 11/1993 |
| JP | 06 158397 | 6/1994 |
| JP | 2000 192298 | 7/2000 |
| JP | 2000 256898 | 9/2000 |
| JP | 01-77117 | 3/2001 |
| SU | 1 618 538 | 1/1991 |
| WO | WO 98/04646 | 2/1998 |
| WO | WO 98/49723 | 11/1998 |
| WO | WO 99/46081 | 9/1999 |
| WO | WO 99/46353 | 9/1999 |
| WO | WO 99/53532 | 10/1999 |
| WO | WO 99/65072 | 12/1999 |
| WO | WO 00/03426 | 1/2000 |
| WO | WO 00/26443 | 5/2000 |
| WO | WO 00/55876 | 9/2000 |
| WO | WO 01/77241 | 10/2001 |
| WO | WO 02/23616 | 3/2002 |
| WO | WO 02/075804 | 9/2002 |
| WO | WO 02/088229 | 11/2002 |
| WO | WO 03/009361 | 1/2003 |
| WO | WO 03/060962 | 7/2003 |
| WO | WO 03/072672 | 9/2003 |
| WO | WO 03/087436 | 10/2003 |
| WO | WO 03/088316 | 10/2003 |

OTHER PUBLICATIONS

International Search Report for PCT/US02/04806 dated Apr. 1, 2003.

International Search Report for PCT/US02/40754 dated Aug. 5, 2003.

Nogami, "*An Innovation to Integrate Porous Low-K Materials and Copper*", *InterConnect Japan 2001*; Honeywell Seminar (Dec. 6, 2001) pp. 1-12.

Partial International Search Report for PCT/US02/40754 dated Apr. 28, 2003.

PCT International Preliminary Examination Report for PCT/US02/04806, dated Sep. 7, 2004.

PCT International Preliminary Examination Report for PCT/US03/06058, dated Sep. 7, 2004.

PCT International Search Report for PCT/US04/17691, dated Nov. 16, 2004.

PCT International Search Report for PCT/US03/06058 dated Jun. 25, 2003.

PCT Written Opinion for PCT/US03/06058, dated Feb. 13, 2004.

PCT Written Opinion for PCT/US04/17691, dated Nov. 16, 2004.

PCT Written Opinion for PCT/US02/0486, dated Mar. 9, 2004.

Robert J. Contolini, "Electrochemical Planarization of ULSI Copper" Jun. 1997, Solid State Technology, pp. 155-156, 158, 160.

Contolini, et al., "Electrochemical Planarization for Multilevel Metallization", *J. Electrochem. Soc.*, vol. 141, No. 9, Sep. 1994, pp. 2503-2510.

Hu, et al. "Copper Interconnection Integration and Reliability", *Thin Solid State Films*, pp. 84-92, (1995).

Jin-Hua, et al., "An XPS and BAW Sensor Study of the Structure and Real-Time Growth Behavious of a Complex Surface Film on Copper in Sodium Chloride Solutions (pH=9), Containing a Low Concentration of Benzotriazole", *Eletrochimica Acta*, vol. 43, Nos. 3-4, pp. 265-274, 1998.

Kaufman, et al., "Chemical-Mechanical Polishing for Fabricating Patterned W Metal Features as Chip Interconnects", *J. Electrochem. Soc.*, vol. 138, No. 11, Nov. 1991; The Electrochemical Society, Inc. pp. 3460-3465.

Padhi, et al., "Planarization of Copper Thin Films by Electropolishing in Phosphoric Acid for ULSI Applications", *Journal of the Electrochemical Society*, 150, pp. G10-G14 (2003).

Qafsaoui, et al., "Quantitative Characterization of Protective Films Grown on Copper in the Presence of Different Triazole Derivative Inhibitors", *Electrochimica Acta 47* (2002), pp. 4339-4346.

Steigerwald, et al., "Effect of Copper Ions in the Slurry on the Chemical-Mechanical Polish Rate of Titanium", *J. Electrochem. Soc.*, vol. 141, No. 12, Dec. 1994, pp. 3512-3516.

Tamilmani, et al., "Potential-pH Diagrams of Interest to Chemical Mechanical Planarization of Copper", *Journal of The Electrochemical Society*, V. 149, pp. G638-G642 (2002).

Tromans, et al., "Growth of Passivating CuBTA Films on Copper in Aqueous Chloride/Benzotriazole Solutions", *Electrochemical and Solid-State Letter*, V. 5, pp. B5-B8 (2002).

Besser et al., "Mechanical Strain Evolution in Cu/low K Interconnect Lines", *Mat. Res. Soc. Symp. Proc.* vol. 795, 2004 Materials Research Society, pp. U1.1.1-U1.1.6.

Chandrasekaran, et al., "Effects of CMP Process Conditions on Defect Generation in Low-k Materials", *Journal of The Electrochemical Society*, pp. G882-G889 (2004).

Chang, et al., "Microleveling Mechanisms and Applications of Electropolishing of Planarization of Copper Mettalization", *J. Vac. Sci. Technol. B 20*(5), Sep./Oct. 2002, pp. 2149-2152.

Chang, et al., "Superpolishing of Planarizing Copper Damascene Interconnects", *Electrochemical and Solid-State Letters*, pp. G72-G74 (2003).

PCT IPRP and Written Opinion dated Dec. 22, 2005.

Deshpande, et al., "Chemical Mechanical Planarization of Copper: Role of Oxidants and Inhibitors", *Journal of The Electrochemical Society*, pp. G788-G794 (2004).

Du, et al., "Effect of Hydrogen Peroxide on Oxidation of Copper in CMP Slurries Containing Glycine and Cu Ions", *Electrochimica Acta*, pp. 4505-4512 (2004).

Du, et al., Mechanism of Copper Removal During CMP in Acidic H2O2 Slurry, *Journal of The Electrochemical Society*, pp. G230-235 (2004).

Economikos, et al., "Integrated Electro-Chemical Mechanical Planarization (Ecmp) for Future Generation Device Technology", 2004 IEEE, pp. 233-235.

Goonetilleke, et al., Voltage-Induced Material Removal for Electrochemical Mechanical Planarization of Copper in Electrolytes Containing NO -3, Glycine, H2O2, Electrochemical and Solid-State Letters, pp. G190-G193 (2005).

Kondo, et al., "Role of Additives for Copper Damascene Electrodeposition: Experimental Study on Inhibition and Acceleration Effects", *Journal of The Electrochemical Society*, pp. C250-C255 (2004).

Mansikkamaki, et al., "Inhibitive Effect of Benzotriazole on Copper Surfaces Studied by SECM", *Journal of the Electrochemical Society*, pp. B12-B16 (2005).

Wang, et al., "Inhibition Effect of AC-Treated, Mixed Self-Assembled Film of Phenylthiourea and 1-Dodecanethiol on Copper Corrosion", *Journal of The Electrochemical Society*, pp. B11-B15 (2004).

ELECTROLYTE WITH GOOD PLANARIZATION CAPABILITY, HIGH REMOVAL RATE AND SMOOTH SURFACE FINISH FOR ELECTROCHEMICALLY CONTROLLED COPPER CMP

CROSS-REFERENCE TO RELATED APPLICATIONS

This application is a continuation of U.S. patent application Ser. No. 10/141,459, filed May 7, 2002, now U.S. Pat. No. 6,863,797, which application is a continuation in part of U.S. patent application Ser. No. 10/032,275, filed Dec. 21, 2001, now U.S. Pat. No. 6,899,804, entitled "Electrolyte Composition and Treatment for Electrolytic Chemical Mechanical Polishing," which applications are herein incorporated by reference.

BACKGROUND OF THE INVENTION

1. Field of the Invention

Embodiments of the present invention relate to electrochemical mechanical polishing. More particularly, embodiments of the present invention relate to an electrolyte solution for copper removal and a method for removing copper from a substrate.

2. Background of the Related Art

Reliably producing sub-half micron and smaller features is one of the key technologies for the next generation of very large scale integration (VLSI) and ultra large-scale integration (ULSI) of semiconductor devices. However, as the limits of circuit technology are pushed, the shrinking dimensions of interconnects in VLSI and ULSI technology have placed additional demands on processing capabilities. Reliable formation of interconnects is important to VLSI and ULSI success and to the continued effort to increase circuit density and quality of individual substrates and die.

Multilevel interconnects are formed using sequential material deposition and material removal techniques on a substrate surface to form features therein. As layers of materials are sequentially deposited and removed, the uppermost surface of the substrate may become non-planar across its surface and require planarization prior to further processing. Planarization or "polishing" is a process where material is removed from the surface of the substrate to form a generally even, planar surface. Planarization is useful in removing excess deposited material and removing undesired surface topography and surface defects, such as rough surfaces, agglomerated materials, crystal lattice damage, scratches, and contaminated layers or materials to provide an even surface for subsequent lithography and processing.

Electrochemical mechanical polishing (ECMP) is one method of planarizing a surface of a substrate. ECMP removes conductive materials from a substrate surface by electrochemical dissolution while polishing the substrate with a reduced mechanical abrasion compared to conventional chemical mechanical planarization (CMP) processes, which may require a high relative down force on a substrate to remove materials, such as copper, from the substrate. A typical ECMP system includes a substrate support and two electrodes disposed within an electrolyte containment basin. In operation, metal atoms on a surface of a substrate are ionized by an electrical current from a source of potential, such as a battery or other voltage source connected to the two electrodes. The metal ions dissolve into the surrounding electrolyte solution at a rate proportional to the electric current. The metal ions from the substrate (anode) either plate the electrode (cathode), fall out of the solution as a precipitate of complexes, or remain in the solution. The destiny of the metal ions depends greatly on the chemistry of the metals and the solution.

While ECMP typically subjects a substrate to a lower down force than CMP, ECMP processing conditions, such as the pressure and the length of processing, may result in damage to the substrate surface. In particular, substrates containing low dielectric constant (low k) dielectric materials, such as carbon doped silicon oxides or other porous low k materials, may be deformed or scratched under ECMP processing conditions.

Therefore, there is a need for compositions and methods for planarizing a substrate with an electrolyte composition that minimizes damage to the substrate during planarization.

SUMMARY OF THE INVENTION

Embodiments of the present invention generally provide electrolyte compositions and methods for using electrolyte compositions to planarize substrate surfaces. In one embodiment, the electrolyte composition includes one or more chelating agents, one or more corrosion inhibitors, and one or more pH adjusting agents.

In another embodiment, the electrolyte composition includes one or more chelating agents, two or more corrosion inhibitors comprising an organic compound having azole groups and a polymeric inhibitor, and one or more pH adjusting agents.

In a further embodiment, the electrolyte composition includes one or more chelating agents, one or more corrosion inhibitors comprising one or more polymeric inhibitors, one or more pH adjusting agents, and one or more electrically resistive additives.

Methods for planarizing a surface of a substrate include polishing the substrate with any of the electrolyte compositions described herein.

BRIEF DESCRIPTION OF THE DRAWINGS

So that the manner in which the above recited aspects of the present invention are attained and can be understood in detail, a more particular description of embodiments of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
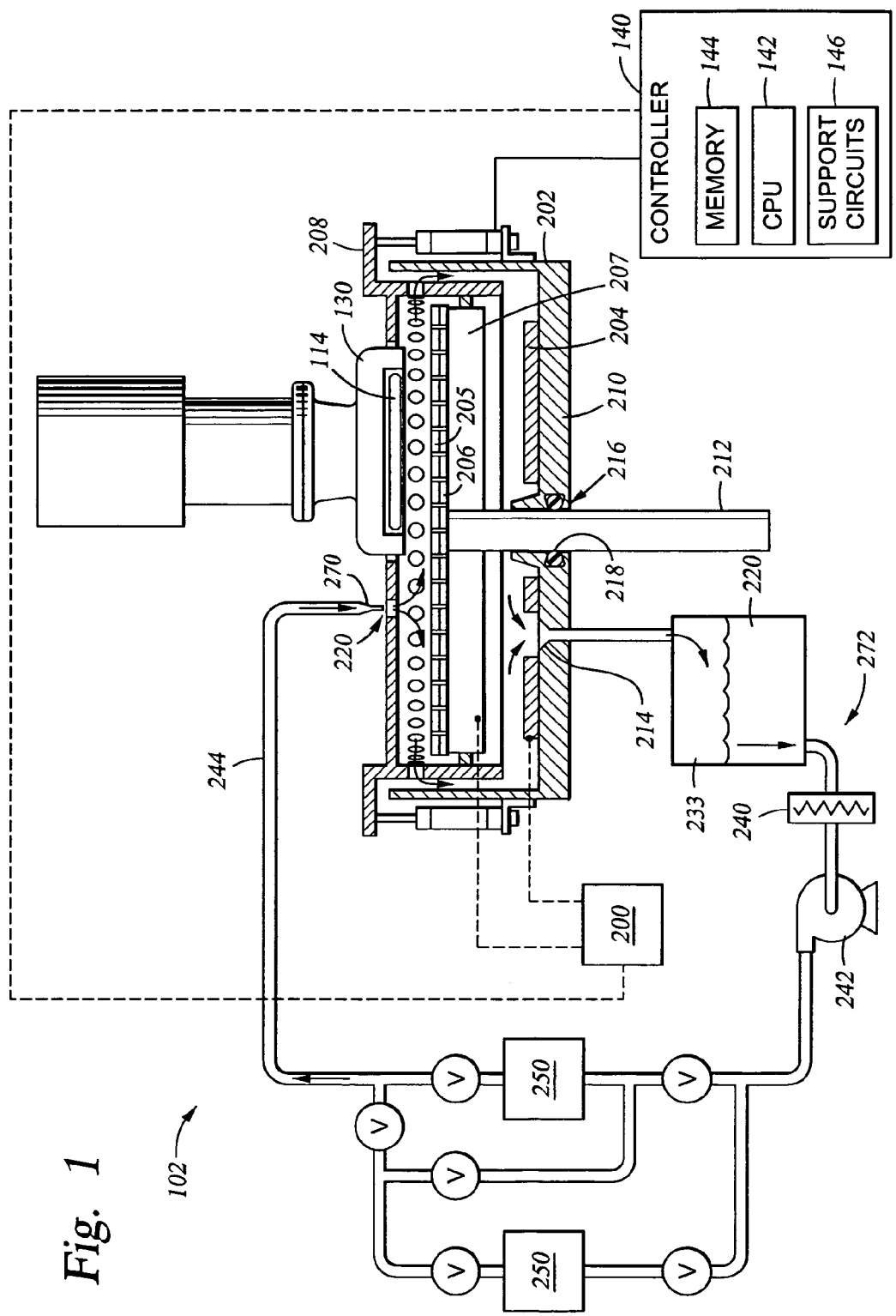
FIG. 1 is a partial section view of a polishing process station.

The words and phrases used herein should be given their ordinary and customary meaning in the art by one skilled in the art unless otherwise further defined. Chemical polishing should be broadly construed and includes, but is not limited to, planarizing a substrate surface using chemical activity. Electropolishing should be broadly construed and includes, but is not limited to, planarizing a substrate by the application of electrochemical activity. Electrochemical mechanical polishing (ECMP) should be broadly construed and includes, but is not limited to, planarizing a substrate by the application of electrochemical activity, mechanical activity, or a combination of both electrochemical and mechanical activity to remove material from a substrate surface. Anodic dissolution should be broadly construed and includes, but is not limited to, the application of an anodic bias to a substrate directly or indirectly which results in the removal of conductive material from a substrate surface and into a surrounding electrolyte composition. Percentages of electrolyte components in electrolyte compositions by volume or weight refer to percentages based on volume for liquid composition components and percentages based on weight for solid composition components.

In one aspect, electrolyte compositions that can planarize metals, such as copper, are provided. Although the electrolyte compositions are particularly useful for removing copper, it is believed that the electrolyte compositions also may be used for the removal of other conductive materials, such as aluminum, platinum, tungsten, titanium, gold, and silver.

In one embodiment, the electrolyte composition comprises one or more chelating agents, one or more corrosion inhibitors, and one or more pH adjusting agents. It is believed that the electrolyte compositions described herein contribute to a high removal rate of material, such as copper, during ECMP, good planarization of substrates, and smooth surfaces of substrates after polishing.

In any of the embodiments described herein, the chelating agents can bind to materials to be removed from the surface of a substrate, such as copper. The one or more chelating agents can include one or more groups selected from the group consisting of amine groups, amide groups, carboxylate groups, dicarboxylate groups, tri-carboxylate groups, and combinations thereof. The one or more chelating agents may include ethylenediamine, hexadiamine, amino acids, ammonium oxalate, ammonium citrate, ammonium succinate, citric acid, monobasic potassium citrate, dibasic potassium citrate, tribasic potassium citrate, tartaric acid, potassium tartarate, ammonium tartarate, succinic acid, potassium succinate, oxalic acid, potassium oxalate, and combinations thereof. The electrolyte composition may include between about 0.1% and about 15% by volume or weight of the one or more chelating agents.

In any of the embodiments described herein, the corrosion inhibitors can prevent the oxidation or corrosion of metal surfaces by forming a layer of material to reduce or minimize chemical interaction between material deposited on a substrate surface and the surrounding electrolyte. The layer of material formed by the corrosion inhibitors insulates the surface from the surrounding electrolyte, and thus, suppresses or minimizes the current on the substrate surface and limits electrochemical deposition and/or dissolution. The one or more corrosion inhibitors can include an organic compound having azole groups. Examples of organic compounds having azole groups include benzotriazole, mercaptobenzotriazole, and 5-methyl-1-benzotriazole. The electrolyte composition may include between about 0.01% and about 1.0% by volume or weight of the organic compound having azole groups.

The one or more pH adjusting agents contribute to the pH adjustment of the electrolyte composition. The preferred pH of the electrolyte composition is typically between about 3 and about 10. pH adjusting agents that can be used include acetic acid, citric acid, oxalic acid, phosphate-containing components, or combinations thereof. Phosphate-containing components that can be used include phosphoric acid, ammonium phosphates, potassium phosphates, or combinations thereof. The electrolyte composition may include between about 0.2% and about 25% by volume or weight of the one or more pH adjusting agents.

The one or more pH adjusting agents may also include a base, such as potassium hydroxide or ammonium hydroxide. The amount of base used in the electrolyte composition is typically the amount required to adjust the pH of the composition to the desired level. For example, the composition may include between about 0.1% and about 10% by volume of a base, such as potassium hydroxide or ammonium hydroxide.

The electrolyte composition may include a base and a compound selected from the group consisting of acetic acid, citric acid, oxalic acid, phosphoric acid, ammonium phosphates, potassium phosphates, or combinations thereof. In compositions which include both a base and a compound selected from the group consisting of acetic acid, citric acid, oxalic acid, phosphoric acid, ammonium phosphates, potassium phosphates, or combinations thereof, the composition may comprise between about 0.1% and about 10% by volume of the base, and between about 0.2% and about 25% by volume or weight of the compound selected from the group consisting of acetic acid, citric acid, oxalic acid, phosphoric acid, ammonium phosphates, potassium phosphates, or combinations thereof.

The balance or remainder of the electrolyte compositions described above typically is or includes deionized water.

An example of an electrolyte composition that includes one or more chelating agents, one or more corrosion inhibitors, and one or more pH adjusting agents is an electrolyte composition that includes about 2% by volume ethylenediamine, about 2% by weight ammonium citrate, about 0.2% by weight benzotriazole, and about 6% by volume phosphoric acid. The pH of the composition is about 6, which may be achieved by, for example, the composition further including potassium hydroxide to adjust the pH to the preferred range. The remainder of the electrolyte composition is deionized water.

In another embodiment, an electrolyte composition comprises one or more chelating agents, two or more corrosion inhibitors comprising an organic compound having azole groups and a polymeric inhibitor, and one or more pH adjusting agents. It is believed that the electrolyte compositions described herein contribute to a high removal rate of material, such as copper, during ECMP, good planarization of substrates, and smooth surfaces of substrates after polishing. It is believed that the compositions described herein have a low viscosity, and thus reduce the amount of friction to which a substrate is exposed during ECMP. Highly viscous electrolyte compositions can increase the friction to a substrate during ECMP, and thus increase the potential for damage to the substrate.

The one or more chelating agents can include one or more groups selected from the group consisting of amine groups, amide groups, carboxylate groups, dicarboxylate groups, tri-carboxylate groups, and combinations thereof. The one or more chelating agents may include ethylenediamine, hexadiamine, amino acids, ammonium oxalate, ammonium citrate, ammonium succinate, citric acid, monobasic potassium citrate, dibasic potassium citrate, tribasic potassium citrate, tartaric acid, potassium tartarate, ammonium tartarate, succinic acid, potassium succinate, oxalic acid, potassium oxalate, and combinations thereof. The electrolyte composition may include between about 0.1% and about 15% by volume or weight of the one or more chelating agents.

The organic compound having azole groups can be selected from the group consisting of benzotriazole, mercaptobenzotriazole, and 5-methyl-1-benzotriazole. Polymeric inhibitors that may be used include polyalkylaryl ether phosphate, ammonium nonylphenol ethoxylate sulfate, polyammonium nonylphenol ethoxylate sulfate, sulfates of nonylphenol ethoxylate, phosphates of nonylphenol ethoxylate, potassium derivatives of nonylphenol ethoxylate sulfate, phosphate derivatives of alkylphenol ethoxylate, sulfate derivatives of alkylphenol ethoxylate, phosphate derivatives of alkylether, sulfate derivatives of alkylether, phosphate derivatives of alkyl alkanol amide, sulfate derivatives of alkyl alkanol amide, polyalkoxylated amide, and combinations thereof. The electrolyte composition may include between about 0.01% and about 1.0% by volume or weight of the organic compound having azole groups and between about 0.002% and about 1.0% by volume or weight of the polymeric inhibitor. It is believed that using the combination of the organic compounds having azole groups and the polymeric inhibitors rather than only a higher concentration of an organic compound having azole groups results in the formation of a softer layer of material that is more easily removed from a substrate surface. Therefore, it is believed that the substrate is less likely to be damaged if such a combination of corrosion inhibitors is used.

The one or more pH adjusting agents contribute to the pH adjustment of the electrolyte composition. The preferred pH of the electrolyte composition is typically between about 3 and about 10. pH adjusting agents that can be used include acetic acid, citric acid, oxalic acid, phosphate-containing components, or combinations thereof. Phosphate-containing components that can be used include phosphoric acid, ammonium phosphates, potassium phosphates, or combinations thereof. The electrolyte composition may include between about 0.2% and about 25% by volume or weight of the one or more pH adjusting agents.

The one or more pH adjusting agents may also include a base, such as potassium hydroxide or ammonium hydroxide. The amount of base used in the electrolyte composition is typically the amount required to adjust the pH of the composition to the desired level. For example, the composition may include between about 0.1% and about 10% by volume of a base, such as potassium hydroxide or ammonium hydroxide.

The electrolyte composition may include a base and a compound selected from the group consisting of acetic acid, citric acid, oxalic acid, phosphoric acid, ammonium phosphates, potassium phosphates, or combinations thereof. In compositions which include both a base and a compound selected from the group consisting of acetic acid, citric acid, oxalic acid, phosphoric acid, ammonium phosphates, potassium phosphates, or combinations thereof, the composition may comprise between about 0.1% and about 10% by volume of the base, and between about 0.2% and about 25% by volume or weight of the compound selected from the group consisting of acetic acid, citric acid, oxalic acid, phosphoric acid, ammonium phosphates, potassium phosphates, or combinations thereof.

The balance or remainder of the electrolyte compositions described above typically is or includes deionized water.

An example of an electrolyte composition that includes one or more chelating agents, two or more corrosion inhibitors comprising an organic compound having azole groups and a polymeric inhibitor, and one or more pH adjusting agents is an electrolyte composition that includes about 2% by volume ethylenediamine, about 4% by weight ammonium citrate, about 0.04% by weight benzotriazole, about 6% by volume phosphoric acid, and about 0.3% by volume ammonium nonylphenol ethoxylate sulfate. The pH of the composition is about 6, which may be achieved by, for example, the composition further including potassium hydroxide to adjust the pH to the preferred range. The remainder of the electrolyte composition is deionized water.

In another embodiment, an electrolyte composition comprises one or more chelating agents, one or more corrosion inhibitors comprising one or more polymeric inhibitors, one or more pH adjusting agents, and one or more electrically resistive additives. The electrically resistive additives reduce the conductivity of the electrolyte composition.

The one or more chelating agents can include one or more groups selected from the group consisting of amine groups, amide groups, carboxylate groups, dicarboxylate groups, tri-carboxylate groups, and combinations thereof. The one or more chelating agents can include ethylenediamine, hexadiamine, amino acids, ammonium oxalate, ammonium citrate, ammonium succinate, citric acid, monobasic potassium citrate, dibasic potassium citrate, tribasic potassium citrate, tartaric acid, potassium tartarate, ammonium tartarate, succinic acid, potassium succinate, oxalic acid, potassium oxalate, and combinations thereof. The electrolyte composition may include between about 0.1% and about 15% by volume or weight of the one or more chelating agents.

Polymeric inhibitors that may be used include polyalkylaryl ether phosphate, ammonium nonylphenol ethoxylate sulfate, polyammonium nonylphenol ethoxylate sulfate, sulfates of nonylphenol ethoxylate, phosphates of nonylphenol ethoxylate, potassium derivatives of nonylphenol ethoxylate sulfate, phosphate derivatives of alkylphenol ethoxylate, sulfate derivatives of alkylphenol ethoxylate, phosphate derivatives of alkylether, sulfate derivatives of alkylether, phosphate derivatives of alkyl alkanol amide, sulfate derivatives of alkyl alkanol amide, polyalkoxylated amide, and combinations thereof. The electrolyte composition may include between about 0.002% and about 1.0% by volume or weight of the polymeric inhibitor.

The one or more pH adjusting agents contribute to the pH adjustment of the electrolyte composition. The preferred pH of the electrolyte composition is typically between about 3 and about 10. pH adjusting agents that can be used include acetic acid, citric acid, oxalic acid, phosphate-containing components, or combinations thereof. Phosphate-containing components that can be used include phosphoric acid, ammonium phosphates, potassium phosphates, or combinations thereof. The electrolyte composition may include between about 0.2% and about 25% by volume or weight of the one or more pH adjusting agents.

The one or more electrically resistive additives are additives that reduce the conductivity of the electrolyte composition. The electrically resistive additives can include polyacrylamide, polyacrylic acid polymers, polycarboxylate copolymers, coconut diethanolamide, oleic diethanolamide, ethanolamide derivatives, or combinations thereof. The electrolyte composition may include between about 0.005% and about 2% by volume or weight of the electrically resistive additives.

The balance or remainder of the electrolyte compositions described above typically is or includes deionized water.

The conductivity of the electrolyte compositions comprising one or more chelating agents, one or more corrosion inhibitors comprising one or more polymeric inhibitors, one or more pH adjusting agents, and one or more electrically resistive additives, may be less than about 30 milliSiemens, such as about 15 milliSiemens. The conductivity of other types of electrolyte compositions that do not include electrically resistive additives can be between about 40 milliSiemens and about 100 milliSiemens.

An example of an electrolyte composition that includes one or more chelating agents, one or more corrosion inhibitors comprising one or more polymeric inhibitors, one or more pH adjusting agents, and one or more electrically resistive additives is an electrolyte composition that includes about 4% by volume ethylenediamine, about 0.2% by volume ammonium nonylphenol ethoxylate sulfate, about 5% by volume phosphoric acid, and about 0.3% by volume oleic diethanolamide. The pH of the electrolyte composition is about 6.0. The remainder of the electrolyte composition is deionized water.

Although the electrolyte compositions described herein are thought to be useful with ECMP, electropolishing, and chemical polishing systems, the electrolyte compositions may be used particularly to advantage in an ECMP process station. A typical ECMP process station is a modified cell on an Electra® Cu Integrated ECP system, available from Applied Materials, Inc. of Santa Clara, Calif. A typical ECMP process station may also be a modified platen on a Reflexion™/Mirra MESA™ Integrated CMP system, both available from Applied Materials, Inc. of Santa Clara, Calif.

FIG. 1 illustrates a partial section view of a polishing station 102. As shown, the polishing station 102 generally includes a basin 202, a first electrode 204, a second electrode 207, a cover 208, and a polishing head 130. The polishing head 130 provides support for a wafer/substrate 114 disposed thereon. Although the polishing station 102 depicts a wafer "face down" configuration, the electrolyte composition 220 may also be used to advantage within a processing chamber utilizing a wafer "face up" configuration. In this alternative configuration, the wafer would rest with its plating side up and the pad would be disposed on the plating surface of the wafer.

Referring to FIG. 1, the first electrode 204 is disposed within the basin 202 and is a conventional electrode having a reactive bias applied thereto to act as a cathode. The first electrode 204 may be made of the metal to be removed from the substrate 114, which may consist of aluminum, copper, gold, silver, or tungsten, for example. Accordingly, for copper removal, the first electrode 204 consists of copper containing materials.

The second electrode 207 is also disposed within the basin 202 and may take the form of a polishing media 205 supported on a lower surface by a perforated disc 206. The polishing media 205 is used to apply a uniform bias to the substrate surface without the use of a conventional bias application apparatus, such as an edge contact. The polishing media 205 can be a pad, web, or belt of material that includes a partially conductive surface for contact with the substrate surface during processing. The partially conductive surface of the polishing media 205 may include materials, such as conductive polymers, polymer composites with conductive materials, conductive metals, conductive fillers, conductive doping materials, or combinations thereof. The partially conductive surface of the polishing media 205 may also be a composite of a conductive polishing material disposed in a conventional polishing material, such as a polymer-noble metal hybrid material like a platinum-polymer hybrid material. The partially conductive surface of the polishing media 205 is described in more detail in the co-pending U.S. patent application, Ser. No. 10/033,732, now U.S. Pat. No. 7,066,800, entitled "Conductive Polishing Media For Electrochemical Mechanical Polishing", filed on Dec. 27, 2001, which is incorporated by reference herein.

The basin 202 can be a bowl shaped member made of a plastic such as fluoropolymers, TEFLON®, PFA, PE, PES, or other materials that are compatible with electroplating and electropolishing chemistries. The basin 202 has a bottom 210 that includes an aperture 216 and a drain 214. The aperture 216 is generally disposed in the center of the bottom 210 and allows a shaft 212 to pass there-through. A seal 218 is disposed between the aperture 216 and the shaft 212 and allows the shaft 212 to rotate while preventing fluids disposed in the basin 202 from passing through the aperture 216.

The electrolyte composition 220 is introduced into the polishing station 102 through a supply line 244. The electrolyte composition 220 is disposed in the basin 202 and generally flows out of the polishing station 102 through the drain 214.

A substrate 114 is disposed on the substrate support 130 which may be a polishing head used in a chemical mechanical planarization process as shown. The substrate support 130 typically applies a pressure in the range of about 0.1 psi to about 1 psi to the substrate surface to be electrochemically and mechanically polished. On the substrate support 130, the substrate 114 is exposed to the electrolyte composition 220 and contacted with the second electrode 207. A bias from a power source 200 is then applied to both electrodes 204 and 207. The bias typically ranges from about −15 volts to about 15 volts. In one aspect, the positive bias ranges from about 0.1 volts to about 10 volts and the negative bias ranges from about 0.1 to about 10 volts. Alternatively, the bias may be a current density between about 0.01 and about 40 milliamps/$cm^2$ for a 200 mm substrate. The bias may be varied in power and application depending upon the user requirements in removing material from the substrate surface. The bias may also be applied by an electrical pulse modulation technique, which applies a constant current density or voltage for a first time period, then applies a constant reverse current density or voltage for a second time period, and repeats the first and second steps, as is described in U.S. Pat. No. 6,379,223, entitled "Method And Apparatus For Electrochemical Mechanical Planarization", issued on Oct. 30, 2002, which is incorporated by reference herein.

To facilitate control of the polishing process, a controller 140 comprising a central processing unit (CPU) 142, memory 144, and support circuits 146, is connected to the polishing station 102. The CPU 142 may be one of any form of computer processors that are used in industrial settings for controlling various drives and pressures. The memory 144 is connected to the CPU 142, and may be one or more of a readily available memory such as random access memory (RAM), read only memory (ROM), floppy disk, hard disk, or any other form of digital storage, local or remote. Software instructions and data can be coded and stored within the memory 144 for instructing the CPU 142. The support circuits 146 are also connected to the CPU 142 for supporting the processor 142 in a conventional manner. The support circuits 146 may include cache, power supplies, clock circuits, input/output circuitry, subsystems, and the like.

Other systems may be used with the electrolyte compositions described herein to planarize or polish substrates. For example, the polishing systems described in U.S. Provisional Patent Application Ser. No. 60/342,281, entitled "Method And Apparatus For Face-Up Substrate Polishing," filed on Dec. 19, 2001, and incorporated by reference herein, and in U.S. Pat. No. 6,613,200, entitled "Electro-Chemical Plating With Reduced Thickness And Integration With Chemical Mechanical Polisher Into A Single Platform," issued on Mar. 2, 2004, and incorporated by reference herein may be used.

EXAMPLES

The following non-limiting examples are provided to further illustrate the embodiments of the invention. However, the examples are not intended to be all inclusive and are not intended to limit the scope of the invention described herein above.

Example 1

A copper plated wafer was polished and planarized using the following electrolyte composition within a modified cell on an Electra® Cu Integrated ECP system, available from Applied Materials, Inc. of Santa Clara, Calif.
- about 2% by volume ethylenediamine;
- about 2% by weight ammonium citrate;
- about 0.2% by weight benzotriazole;
- about 6% by volume phosphoric acid;
- between about 2% and about 6% potassium hydroxide; and
- deionized water The pH of the composition was about 6.0.

Example 2

A copper plated wafer was polished and planarized using the following electrolyte composition within a modified cell on an Electra® Cu Integrated ECP system, available from Applied Materials, Inc. of Santa Clara, Calif.
- about 2% by volume ethylenediamine;
- about 4% by weight ammonium citrate;
- about 0.04% by weight benzotriazole;
- about 6% by volume phosphoric acid;
- about 0.3% by volume ammonium nonylphenol ethoxylate sulfate;
- between about 2% and about 6% potassium hydroxide; and
- deionized water.

The pH of the composition was about 6.0.

Example 3

A copper plated wafer was polished and planarized using the following electrolyte composition within a modified cell on an Electra® Cu Integrated ECP system, available from Applied Materials, Inc. of Santa Clara, Calif.
- about 4% by volume ethylenediamine;
- about 0.2% by volume ammonium nonylphenol ethoxylate sulfate;
- about 5% by volume phosphoric acid;
- about 0.3% by volume oleic diethanolamide; and
- deionized water.

The pH of the composition was about 6.0.

While the foregoing is directed to embodiments of the present invention, other and further embodiments of the invention may be devised without departing from the basic scope thereof, and the scope thereof is determined by the claims that follow.

What is claimed is:

1. A composition for planarizing a substrate, initially comprising:
   - an electrolyte;
   - one or more chelating agents having one or more groups selected from the group consisting of amine groups, amide groups, carboxylate groups, dicarboxylate groups, tri-carboxylate groups, and combinations thereof;
   - one or more corrosion inhibitors comprising an organic compound having azole groups and a polymeric inhibitor;
   - one or more pH adjusting agents in an amount sufficient to provide a pH between about 3 and about 10; and
   - deionized water.

2. The composition of claim 1, wherein the one or more chelating agents are selected from the group consisting of ethylenediamine, hexadiamine, amino acids, ammonium oxalate, ammonium citrate, ammonium succinate, citric acid, monobasic potassium citrate, dibasic potassium citrate, tribasic potassium citrate, tartaric acid, potassium tartarate, ammonium tartarate, succinic acid, potassium succinate, oxalic acid, potassium oxalate, and combinations thereof.

3. The composition of claim 1, wherein the electrolyte comprises a phosphate-containing component selected from the group consisting of phosphoric acid, ammonium phosphates, potassium phosphates, and combinations thereof.

4. The composition of claim 1, wherein the one or more pH adjusting agents comprise a base selected from the group consisting of potassium hydroxide, ammonium hydroxide, and combinations thereof.

5. The composition of claim 1, wherein the corrosion inhibitor having an azole group is selected from the group consisting of benzotriazole, mercaptobenzotriazole, 5-methyl-1-benzotriazole, and combinations thereof.

6. The composition of claim 5, wherein the polymeric inhibitor is selected from the group consisting of polyalkylaryl ether phosphate, ammonium nonylphenol ethoxylate sulfate, polyammonium nonylphenol ethoxylate sulfate, sulfates of nonylphenol ethoxylate, phosphates of nonylphenol ethoxylate, potassium derivatives of nonylphenol ethoxylate sulfate, phosphate derivatives of alkylphenol ethoxylate, sulfate derivatives of alkylphenol ethoxylate, phosphate derivatives of alkylether, sulfate derivatives of alkylether, phosphate derivatives of alkyl alkanol amide, sulfate derivatives of alkyl alkanol amide, polyalkoxylated amide, and combinations thereof.

7. The composition of claim 1, wherein the polymeric inhibitor is selected from the group consisting of polyalkylaryl ether phosphate, ammonium nonylphenol ethoxylate sulfate, polyammonium nonylphenol ethoxylate sulfate, sulfates of nonylphenol ethoxylate, phosphates of nonylphenol ethoxylate, potassium derivatives of nonylphenol ethoxylate sulfate, phosphate derivatives of alkylphenol ethoxylate, sulfate derivatives of alkylphenol ethoxylate, phosphate derivatives of alkylether, sulfate derivatives of alkylether, phosphate derivatives of alkyl alkanol amide, sulfate derivatives of alkyl alkanol amide, polyalkoxylated amide, and combinations thereof.

8. The composition of claim 1, wherein:
   - the electrolyte comprises a phosphate-containing component selected from the group consisting of phosphoric acid, ammonium phosphates, potassium phosphates, and combinations thereof;
   - the one or more chelating agents are selected from the group consisting of ethylenediamine, hexadiamine, amino acids, ammonium oxalate, ammonium citrate, ammonium succinate, citric acid, monobasic potassium citrate, dibasic potassium citrate, tribasic potassium citrate, tartaric acid, potassium tartarate, ammonium tartarate, succinic acid, potassium succinate, oxalic acid, potassium oxalate, and combinations thereof;

the one or more corrosion inhibitors having an azole group are selected from the group consisting of benzotriazole, mercaptobenzotriazole, and 5-methyl-1-benzotriazole; and the one or more pH adjusting agents comprise a base selected from the group consisting of potassium hydroxide and ammonium hydroxide, to provide a ph between about 3 and about 10.

9. A method for planarizing a surface of a substrate, comprising polishing the substrate with a composition initially comprising:

an electrolyte;

one or more chelating agents having one or more groups selected from the group consisting of amine groups, amide groups, carboxylate groups, dicarboxylate groups, tri-carboxylate groups, and combinations thereof;

one or more corrosion inhibitors comprising an organic compound having azole groups and a polymeric inhibitor;

one or more pH adjusting agents in an amount sufficient to provide a pH between about 3 and about 10; and deionized water.

10. The method of claim 9, wherein the one or more chelating agents are selected from the group consisting of ethylenediamine, hexadiamine, amino acids, ammonium oxalate, ammonium citrate, ammonium succinate, citric acid, monobasic potassium citrate, dibasic potassium citrate, tribasic potassium citrate, tartaric acid, potassium tartarate, ammonium tartarate, succinic acid, potassium succinate, oxalic acid, potassium oxalate, and combinations thereof.

11. The method of claim 9, wherein the electrolyte comprises a phosphate-containing component selected from the group consisting of phosphoric acid, ammonium phosphates, potassium phosphates, and combinations thereof.

12. The method of claim 9, wherein the one or more pH adjusting agents comprise a base selected from the group consisting of potassium hydroxide, ammonium hydroxide, and combinations thereof.

13. The method of claim 9, wherein the corrosion inhibitor having an azole group is selected from the group consisting of benzotriazole, mercaptobenzotriazole, 5-methyl-1-benzotriazole, and combinations thereof.

14. The method of claim 13, wherein the polymeric inhibitor is selected from the group consisting of polyalkylaryl ether phosphate, ammonium nonylphenol ethoxylate sulfate, polyammonium nonylphenol ethoxylate sulfate, sulfates of nonylphenol ethoxylate, phosphates of nonylphenol ethoxylate, potassium derivatives of nonylphenol ethoxylate sulfate, phosphate derivatives of alkylphenol ethoxylate, sulfate derivatives of alkylphenol ethoxylate, phosphate derivatives of alkylether, sulfate derivatives of alkylether, phosphate derivatives of alkyl alkanol amide, sulfate derivatives of alkyl alkanol amide, polyalkoxylated amide, and combinations thereof.

15. The method of claim 9, wherein the polymeric inhibitor is selected from the group consisting of polyalkylaryl ether phosphate, ammonium nonylphenol ethoxylate sulfate, polyammonium nonylphenol ethoxylate sulfate, sulfates of nonylphenol ethoxylate, phosphates of nonylphenol ethoxylate, potassium derivatives of nonylphenol ethoxylate sulfate, phosphate derivatives of alkylphenol ethoxylate, sulfate derivatives of alkylphenol ethoxylate, phosphate derivatives of alkylether, sulfate derivatives of alkylether, phosphate derivatives of alkyl alkanol amide, sulfate derivatives of alkyl alkanol amide, polyalkoxylated amide, and combinations thereof.

16. The method of claim 9, wherein:

the electrolyte comprises a phosphate-containing component selected from the group consisting of phosphoric acid, ammonium phosphates, potassium phosphates, and combinations thereof;

the one or more chelating agents are selected from the group consisting of ethylenediamine, hexadiamine, amino acids, ammonium oxalate, ammonium citrate, ammonium succinate, citric acid, monobasic potassium citrate, dibasic potassium citrate, tribasic potassium citrate, tartaric acid, potassium tartarate, ammonium tartarate, succinic acid, potassium succinate, oxalic acid, potassium oxalate, and combinations thereof;

the one or more corrosion inhibitors having an azole group are selected from the group consisting of benzotriazole, mercaptobenzotriazole, and 5-methyl-1-benzotriazole; and the one or more pH adjusting agents comprise a base selected from the group consisting of potassium hydroxide and ammonium hydroxide, to provide a ph between about 3 and about 10.

* * * * *

UNITED STATES PATENT AND TRADEMARK OFFICE
CERTIFICATE OF CORRECTION

PATENT NO. : 7,384,534 B2  
APPLICATION NO. : 11/074274  
DATED : June 10, 2008  
INVENTOR(S) : Sun et al.

Page 1 of 1

It is certified that error appears in the above-identified patent and that said Letters Patent is hereby corrected as shown below:

<u>Title Page, Col. 2, In the References Cited under Foreign Pat. Doc.:</u>

Please insert --JP 10 121297 5/1998--;

Column 10, Claim 6, Line 30, please delete "5" and insert --1-- therefor;

Column 10, Claim 7, Line 42, please delete "1" and insert --5-- therefor;

Column 11, Claim 14, Line 44, please delete "13" and insert --9-- therefor;

Column 12, Claim 15, Line 11, please delete "9" and insert --13-- therefor.

Signed and Sealed this

Eleventh Day of November, 2008

JON W. DUDAS  
*Director of the United States Patent and Trademark Office*